US011721670B2

(12) United States Patent
Tsubakidani et al.

(10) Patent No.: US 11,721,670 B2
(45) Date of Patent: Aug. 8, 2023

(54) POWER MODULE (71) Applicant: Mitsubishi Electric Corporation, Tokyo (JP)

(72) Inventors: Takashi Tsubakidani, Tokyo (JP); Kosuke Yamaguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 30 days.

(21) Appl. No.: 17/203,938

(22) Filed: Mar. 17, 2021

(65) Prior Publication Data
US 2021/0384163 A1 Dec. 9, 2021

(30) Foreign Application Priority Data

Jun. 3, 2020 (JP) ................. 2020-096847

(51) Int. Cl.
H01L 25/065 (2023.01)
H03K 17/687 (2006.01)
H01L 25/18 (2023.01)
H03K 17/0812 (2006.01)
H01L 23/00 (2006.01)

(52) U.S. Cl.
CPC .......... H01L 25/0657 (2013.01); H01L 24/05 (2013.01); H01L 24/29 (2013.01); H01L 24/45 (2013.01); H01L 25/18 (2013.01); H03K 17/08122 (2013.01); H03K 17/687 (2013.01); H01L 2224/05552 (2013.01); H01L 2224/2908 (2013.01); H01L 2225/06503 (2013.01)

(58) Field of Classification Search
CPC ............... H01L 25/0657; H03K 17/08122
See application file for complete search history.

(56) References Cited

U.S. PATENT DOCUMENTS 7,262,586 B1 * 8/2007 Gradinariu ............ G05F 1/56
 323/280
2012/0181996 A1 7/2012 Gehrke
2014/0063744 A1 3/2014 Lopez et al.
2015/0049448 A1 * 2/2015 Uehara ............ H01L 25/0657
 361/767

FOREIGN PATENT DOCUMENTS

JP 2005-277014 A 10/2005
JP 2015-530748 A 10/2015
JP 2020-014315 A 1/2020

OTHER PUBLICATIONS

An Office Action; "Notice of Reasons for Refusal," mailed by the Japanese Patent Office dated May 30, 2023, which corresponds to Japanese Patent Application No. 2020-096847 and is related to U.S. Appl. No. 17/203,938; with English translation.

* cited by examiner

Primary Examiner — Dale E Page
Assistant Examiner — Wilner Jean Baptiste
(74) Attorney, Agent, or Firm — Studebaker & Brackett PC (57) ABSTRACT A second semiconductor switching element is connected in series with a first semiconductor switching element, and is at least partially stacked on the first semiconductor switching element in the thickness direction. A first control element controls the first semiconductor switching element and the second semiconductor switching element, and performs an overcurrent protection operation with reference to a shunt voltage. The first control element is arranged outside the first semiconductor switching element and the second semiconductor switching element in the in-plane direction.

10 Claims, 6 Drawing Sheets

POWER MODULE

BACKGROUND OF THE INVENTION

Field of the Invention

The present disclosure relates to a power module, and more particularly to a power module having a first control element for controlling a first semiconductor switching element and a second semiconductor switching element.

Description of the Background Art

Japanese Patent Application Laid-Open No. 2005-277014 discloses a semiconductor device for operating a load. This semiconductor device includes a first support plate, a first semiconductor switching element on the first support plate, a second support plate on the first semiconductor switching element, a second semiconductor switching element on the second support plate, a third support plate on the second semiconductor switching element, and a control element on the third support plate. The first semiconductor switching element and the second semiconductor switching element are connected in series with each other. During operation, the first support plate is connected to a positive terminal of a DC power supply, and the third support plate is connected to a ground terminal of the DC power supply. The third support plate can be a ground electrode of the control element. The control element applies a control signal to the first semiconductor switching element and the second semiconductor switching element to alternately switch the first semiconductor switching element and the second semiconductor switching element.

Various advantages can be obtained by stacking a plurality of elements in the thickness direction as described above. For example, the plane size of the semiconductor device can be reduced. Moreover, a wiring structure between the elements can be simplified.

Japanese Patent Application Laid-Open No. 2020-014315 discloses a power semiconductor element. This power semiconductor element includes a high-side switching element, a low-side switching element connected in series with the high-side switching element, a high-side control circuit that controls the on/off drive of the high-side switching element, a low-side control circuit that controls the on/off drive of the low-side switching element, and a current detection circuit. The current flowing through the low-side switching element is converted into a shunt voltage by a shunt resistor connected between the low-side switching element and a line having a reference potential. The current detection circuit detects that an overcurrent has occurred when the shunt voltage exceeds a preset threshold value, and transmits an overcurrent detection signal to a driver circuit. The driver circuit turns off the low-side switching element when the driver circuit receives the overcurrent detection signal. As a result, the overcurrent protection operation can be performed.

In the technique of above-described Japanese Patent Application Laid-Open No. 2005-277014, a potential on the reference potential side of the second semiconductor switching element as the low-side switching element (the side opposite to the side connected to the first semiconductor switching element as the high-side switching element) is equal to a potential of the third support plate. On the other hand, the reference potential of the control element is also equal to the potential of the third support plate. Therefore, the potential on the reference potential side of the low-side switching element is equal to the reference potential of the control element. Therefore, if a shunt resistor is attached between the reference potential side of the low-side switching element and the reference potential, the reference potential of the control element also fluctuates in response to the fluctuation of the shunt voltage. Due to this potential fluctuation, an excessive current flows through the wiring of the control element, which may cause thermal destruction. The generation of this current can be avoided by using a floating power supply as the power supply for driving the control element. However, the use of a floating power supply complicates the circuit of the semiconductor device. In order to avoid such a problem of complication, when a shunt resistor is used, the reference potential side of the low-side switching element and the reference potential portion of the control element are usually configured not to be short-circuited.

SUMMARY

According to the study of the present inventor, even when the above configuration is used, when all of the plurality of elements are stacked, the fluctuation of the shunt voltage leads to fluctuation of the reference potential of the control element via capacitive coupling between the elements. The magnitude of this potential fluctuation needs to be suppressed to such an extent that problems such as the above-mentioned thermal destruction can be sufficiently avoided. This leads to a limitation on the amount of current that the semiconductor device can generate. The present disclosure has been made to solve the above problems. It is therefore an object of the present disclosure to provide a power module that can reduce an adverse effect of shunt voltage on a control element while utilizing the advantage of stacking a plurality of elements without using a complicated configuration.

A power module according to the present disclosure has a thickness direction and an in-plane direction perpendicular to the thickness direction. The power module includes a first semiconductor switching element, a second semiconductor switching element, and a first control element. The second semiconductor switching element is connected in series with the first semiconductor switching element and is at least partially stacked on the first semiconductor switching element in the thickness direction. The first control element controls the first semiconductor switching element and the second semiconductor switching element, and performs an overcurrent protection operation with reference to the shunt voltage. The first control element is arranged outside the first semiconductor switching element and the second semiconductor switching element in the in-plane direction.

According to the present disclosure, the second semiconductor switching element is at least partially stacked on the first semiconductor switching element. As a result, the advantage of stacking a plurality of elements can be utilized. On the other hand, the first control element is arranged outside the first semiconductor switching element and the second semiconductor switching element in the in-plane direction. In other words, the first control element is not stacked on the first semiconductor switching element and the second semiconductor switching element. Potentials of the first semiconductor switching element and the second semiconductor switching element fluctuate according to the shunt voltage. However, with the above arrangement, the fluctuation leading to fluctuation of the reference potential of the first control element via coupling capacitance can be suppressed. Therefore, an adverse effect of the shunt voltage on the control element can be reduced without using a complicated configuration. From the above, it is possible to reduce the adverse effect of the shunt voltage on the control element without using a complicated configuration while utilizing the advantage of stacking the plurality of elements.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, preferred embodiments will be described with reference to the drawings. In the drawings below, the same or corresponding parts are given the same reference numerals, and their description is not repeated.

First Preferred Embodiment

Figure 1:
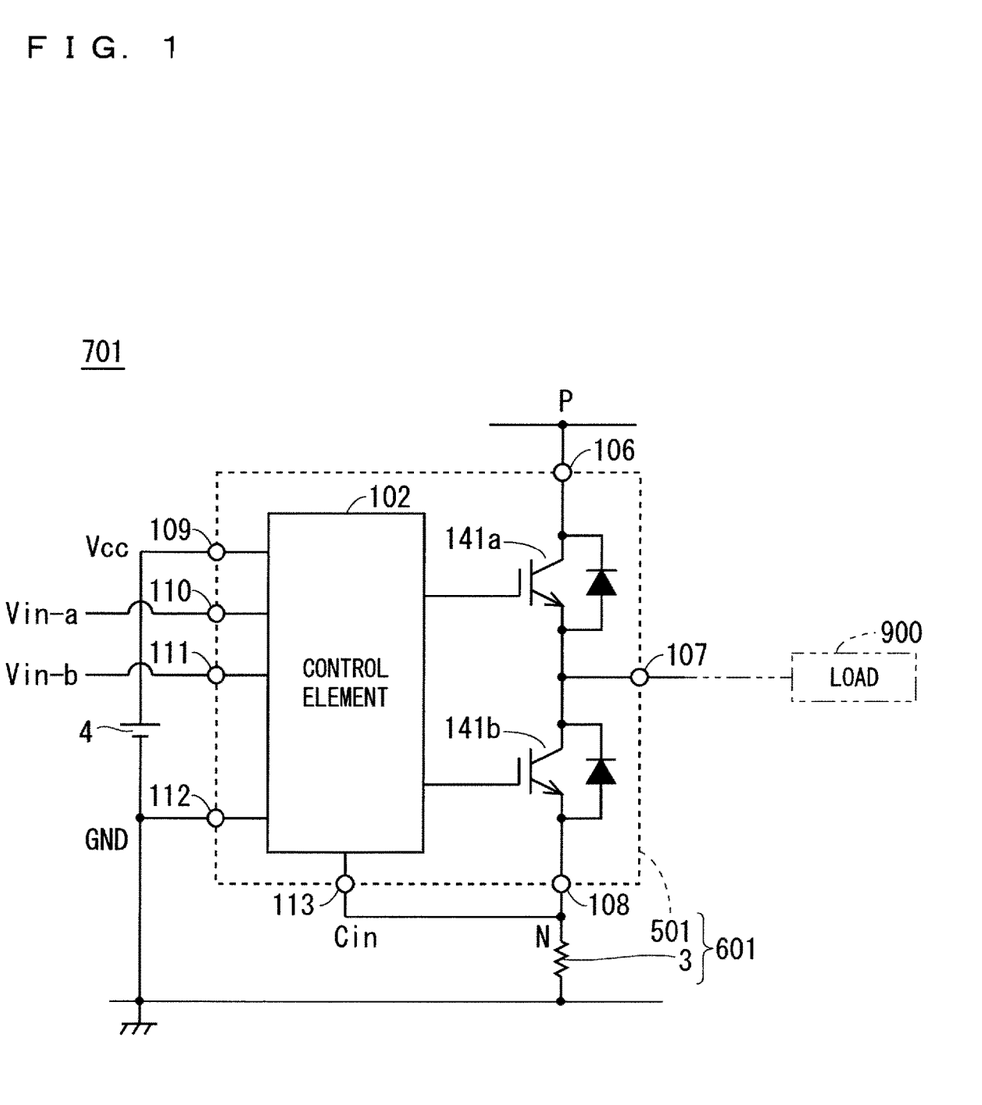
FIG. 1 is a diagram schematically showing a configuration of a system having a power module according to a first preferred embodiment.
Figure 2:
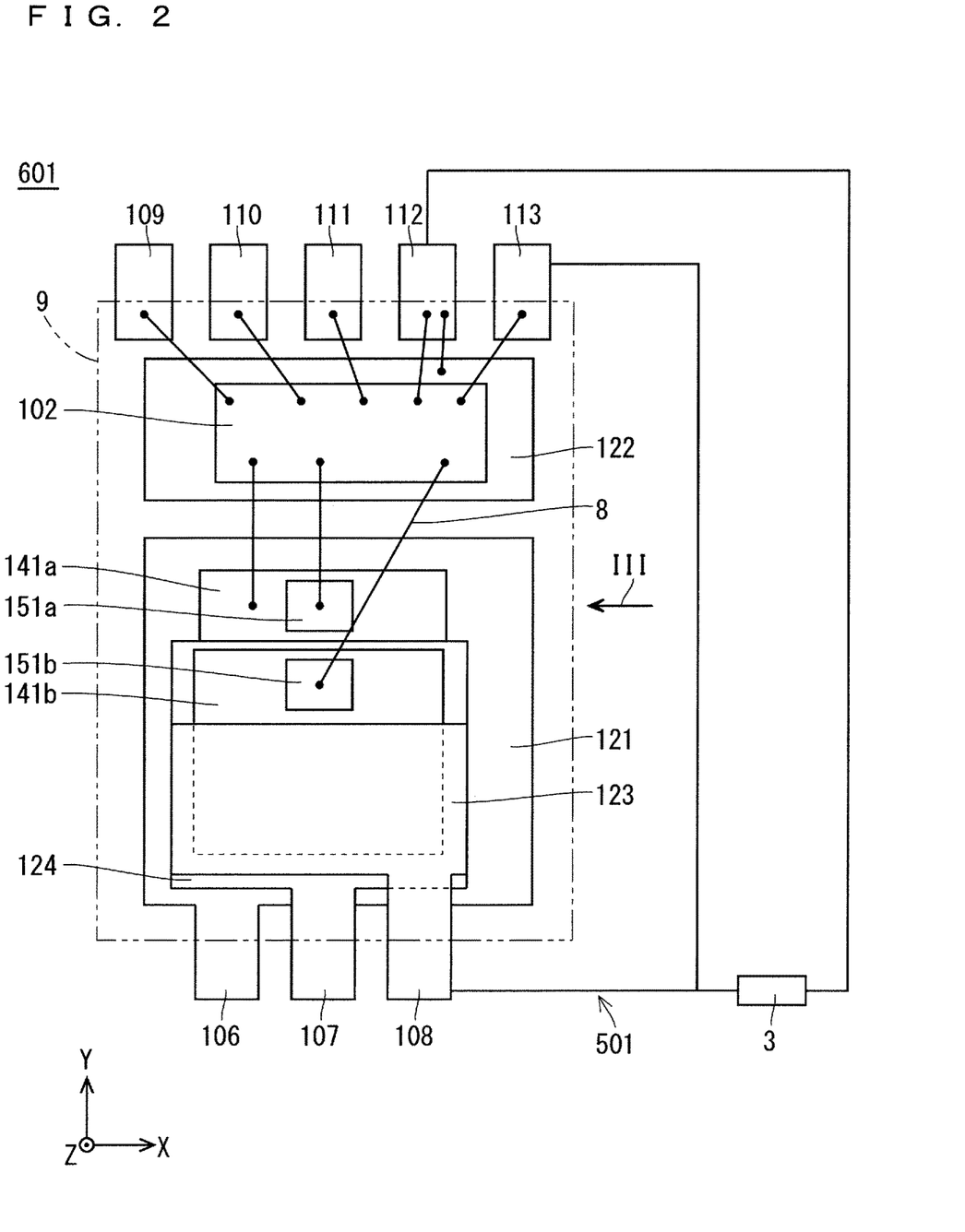
FIG. 2 is a plan view schematically showing a configuration of the power module and a shunt resistor in FIG. 1.
Figure 3:
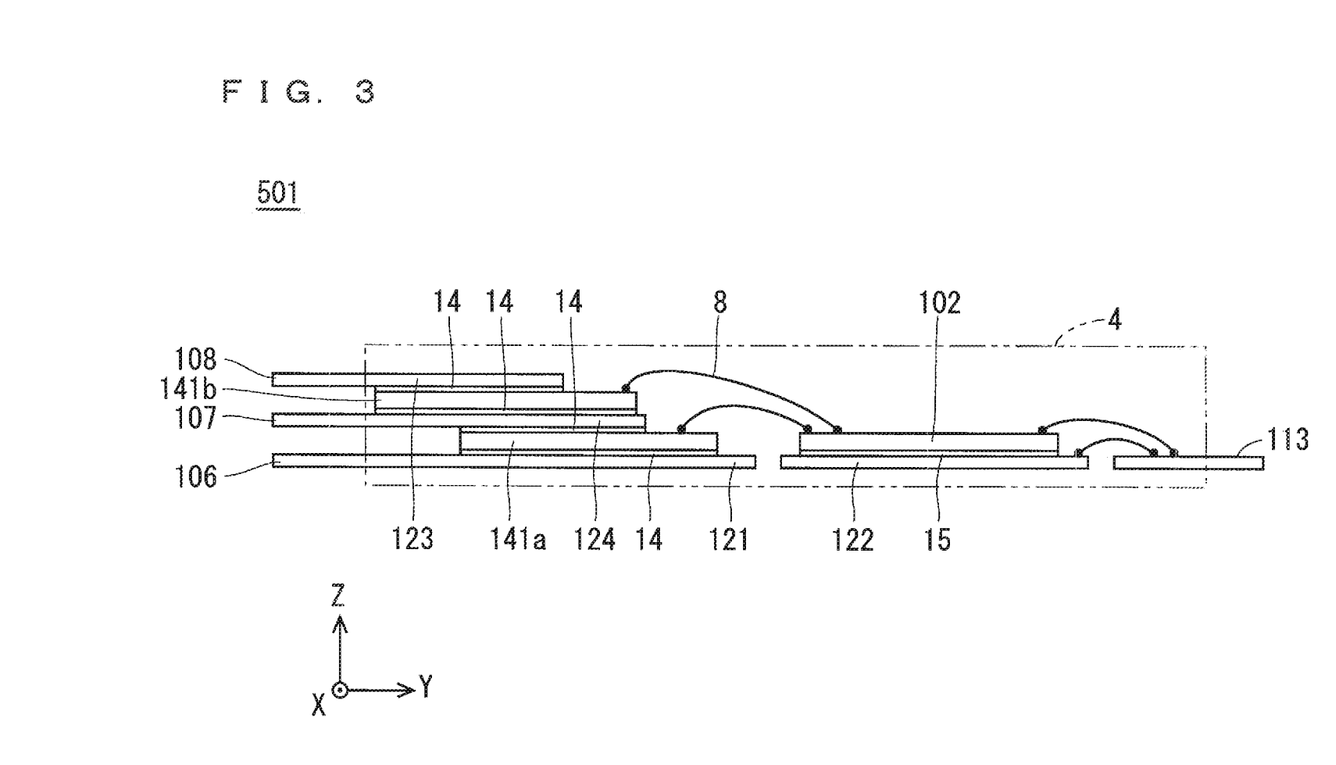
FIG. 3 is a schematic side view from the viewpoint of arrow III in FIG. 2.

FIG. 1 is a diagram schematically showing a configuration of a system 701 having a load 900 and a load drive device 601 for driving the load 900 according to the first preferred embodiment. FIG. 2 is a plan view schematically showing a configuration of the load drive device 601 and FIG. 3 is a schematic side view from the viewpoint of arrow III (FIG. 2). The load drive device 601 has a power module 501 and a shunt resistor 3. In FIGS. 2 and 3, the XYZ Cartesian coordinate system is shown. The Z direction of the coordinate system corresponds to the thickness direction of the power module 501, and the XY direction of the coordinate system corresponds to the in-plane direction perpendicular to the thickness direction of the power module 501.

Further, the power module 501 includes a high-side switching element 141*a* (first semiconductor switching element), a low-side switching element 141*b* (second semiconductor switching element), and a control element 102 (first control element). The power module 501 includes a case 9, a metal plate 121 (first metal plate), a metal plate 122 (second metal plate), a metal plate 123 (third metal plate), and a metal plate 124 (fourth metal plate).

The low-side switching element 141*b* is connected in series with the high-side switching element 141*a*. Each of the high-side switching element 141*a* and the low-side switching element 141*b* is a switching element, for example, Metal Insulator Semiconductor Field Effect Transistor (MISFET) or Insulated Gate Bipolar Transistor (IGBT). As shown in FIG. 1, the switching element may be internally or externally loaded with a freewheeling diode. The high-side switching element 141*a* and the low-side switching element 141*b* have a gate pad 151*a* and a gate pad 151*b*, respectively, in order to receive a control signal from the control element 102.

The control element 102 controls the high-side switching element 141*a* and the low-side switching element 141*b*. Specifically, the control element 102 sends a control signal to the gate pad 151*a* and the gate pad 151*b* in response to an external signal. Further, the control element 102 refers to a shunt voltage and performs an overcurrent protection operation as necessary. The control element 102 may be configured as a single component as shown in FIGS. 2 and 3, or as a modification, may be configured with a component that controls the high-side switching element 141*a* and a component that controls the low-side switching element 141*b*.

The power module 501 also includes a P terminal 106 (high voltage input terminal), an output terminal 107, an N terminal 108 (reference potential side terminal), a Vcc terminal 109 (power supply terminal), a Vin-a terminal 110 (first external signal input terminal), Vin-b terminal 111 (second external signal input terminal), a GND terminal 112 (reference potential terminal), and a Cin terminal 113 (shunt voltage input terminal). These terminals are exposed from the inside to the outside of the case 9 of the power module 501, and typically protruded as shown in FIG. 2.

In the present preferred embodiment, the shunt resistor 3 is arranged outside the case 9. As a modification, the shunt resistor 3 may be arranged inside the case 9, whereby the load drive device 601 having the shunt resistor 3 is configured as one power module.

The load 900 is connected to the output terminal 107, whereby current for driving the load 900 is supplied from the output terminal 107. A reference potential (ground potential) is applied to the GND terminal 112. The reference potential is applied to each of the N terminal 108 and the Cin terminal 113 via the shunt resistor 3. A positive voltage (DC voltage) with respect to the reference potential is applied to the P terminal 106. A power supply 4 that generates a power supply voltage with respect to the reference potential is connected to the Vcc terminal 109 (power supply terminal), and the control element 102 is operated using this power supply voltage. Each of the Vin-a terminal 110 and the Vin-b terminal 111 receives a control signal for the high-side switching element 141*a* and the low-side switching element 141*b*.

As shown in FIGS. 2 and 3, the output terminal 107 may be configured as one metal member together with the metal plate 124. The GND terminal 112 may be short-circuited to the metal plate 122 by a bonding wire 8 (wiring member) as shown in FIG. 2, or may be configured as one metal member together with the metal plate 122 as a modification. As shown in FIG. 2, the N terminal 108 may be configured as one metal member together with the metal plate 123. As shown in FIG. 2, the P terminal 106 may be configured as one metal member together with the metal plate 121. The Cin terminal 113, the Vcc terminal 109, the Vin-a terminal 110, and the Vin-b terminal 111 may be connected to the control element 102 by the bonding wire 8 as shown in FIG. 2.

The high-side switching element 141*a* is mounted on the metal plate 121 via a conductive bonding layer 14. The metal plate 124 is bonded onto the high-side switching element 141*a* via a conductive bonding layer 14. The low-side switching element 141*b* is mounted on the metal plate 124 via a conductive bonding layer 14. The metal plate 123 is bonded onto the low-side switching element 141b via a conductive bonding layer 14.

With the above configuration, the low-side switching element 141b is at least partially stacked on the high-side switching element 141a in the thickness direction via the metal plate 124. In the configuration shown in FIG. 2, the low-side switching element 141b is partially stacked on the high-side switching element 141a in the thickness direction in a way such that the gate pad 151a of the high-side switching element 141a is outside the low-side switching element 141b in the in-plane direction. The power module 501 has a bonding wire 8 having one end bonded to the gate pad 151a and the other end bonded to the control element 102. The power module 501 also has a bonding wire 8 having one end bonded to the gate pad 151b and the other end bonded to the control element 102. As a result, each of the gate pad 151a and the gate pad 151b is electrically connected to the control element 102.

The metal plate 122 is separated from the metal plate 121. In the present preferred embodiment, the reference potential is applied to the metal plate 122, and the positive voltage is applied to the metal plate 121 from the P terminal 106. The control element 102 is mounted on the metal plate 122 via a conductive bonding layer 15. The conductive bonding layer 15 mechanically bonds the control element 102 onto the metal plate 122, and also electrically connects the control element 102 to the metal plate 122. When the metal plate 122 and the GND terminal 112 are integrated or electrically connected by the bonding wire 8, an insulating bonding layer may be used instead of the conductive bonding layer 15, as a modification, to use the potential of the metal plate 121 as the reference potential.

As shown in FIG. 2, the control element 102 is arranged outside the high-side switching element 141a and the low-side switching element 141b in the in-plane direction. Further, as shown in FIG. 2, the metal plate 122 is arranged outside the high-side switching element 141a and the low-side switching element 141b in the in-plane direction.

Figure 4:
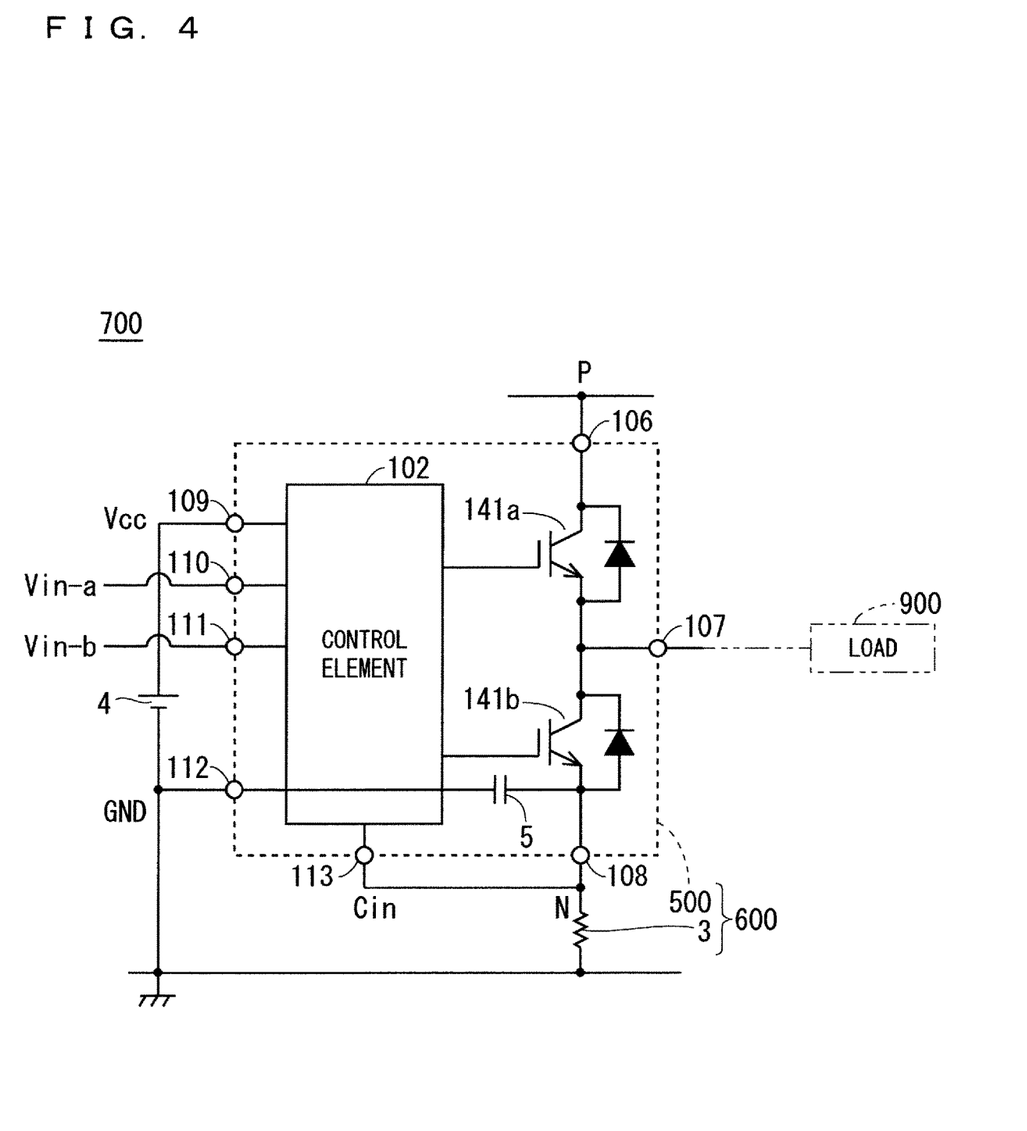
FIG. 4 is a diagram schematically showing a configuration of a system having a power module of a comparative example.

FIG. 4 is a diagram schematically showing a configuration of a system 700 of a comparative example. In a power module 500 of the system 700, unlike the present preferred embodiment, the control element 102 is bonded to the metal plate 123 (see FIG. 2) via an insulating bonding layer. Therefore, in the comparative example, the control element 102 is not arranged outside the high-side switching element 141a and the low-side switching element 141b in the in-plane direction. As a result, a coupling capacitance 5 is generated between a portion of the control element 102 that is desired to be maintained at the reference potential and the metal plate 123 to which the shunt voltage is applied from the N terminal 108. Therefore, the fluctuation of the shunt voltage via this coupling capacitance 5 fluctuates a potential of the portion of the control element 102 that is desired to be maintained at the reference potential. Due to this potential fluctuation, an excessive current flows through the wiring of the control element 102, which may cause thermal destruction. The generation of this current can be avoided by using a floating power supply as the power supply 4 for driving the control element 102. However, the use of a floating power supply complicates the circuit of the system 700.

According to the present preferred embodiment, the low-side switching element 141b is at least partially stacked on the high-side switching element 141a. As a result, the advantage of stacking a plurality of elements can be utilized. In other words, the control element 102 is not stacked on the high-side switching element 141a and the low-side switching element 141b. The potentials of the high-side switching element 141a and the low-side switching element 141b fluctuate according to the shunt voltage. However, with the above arrangement, the fluctuation leading to fluctuation of the reference potential of the control element 102 via the coupling capacitance 5 (FIG. 4) can be suppressed. Therefore, an adverse effect of the shunt voltage on the control element 102 can be reduced without using a complicated configuration. From the above, it is possible to reduce the adverse effect of the shunt voltage on the control element 102 without using a complicated configuration while utilizing the advantage of stacking a plurality of elements.

As shown in FIG. 2, the metal plate 122 is arranged outside the high-side switching element 141a and the low-side switching element 141b in the in-plane direction. The potentials of the high-side switching element 141a and the low-side switching element 141b fluctuate according to the shunt voltage. However, with the above arrangement, the fluctuation leading to fluctuation of the potential of the metal plate 122 via the coupling capacitance 5 (FIG. 4) can be suppressed. Therefore, when the potential of the metal plate 122 corresponds to the reference potential of the control element 102, the adverse effect of the shunt voltage on the control element 102 can be further reduced.

The conductive bonding layer 15 (FIG. 3) is provided between the metal plate 122 and the control element 102. As a result, a configuration in which the potential of the metal plate 122 corresponds to the reference potential of the control element 102 can be easily obtained.

Second Preferred Embodiment

Figure 5:
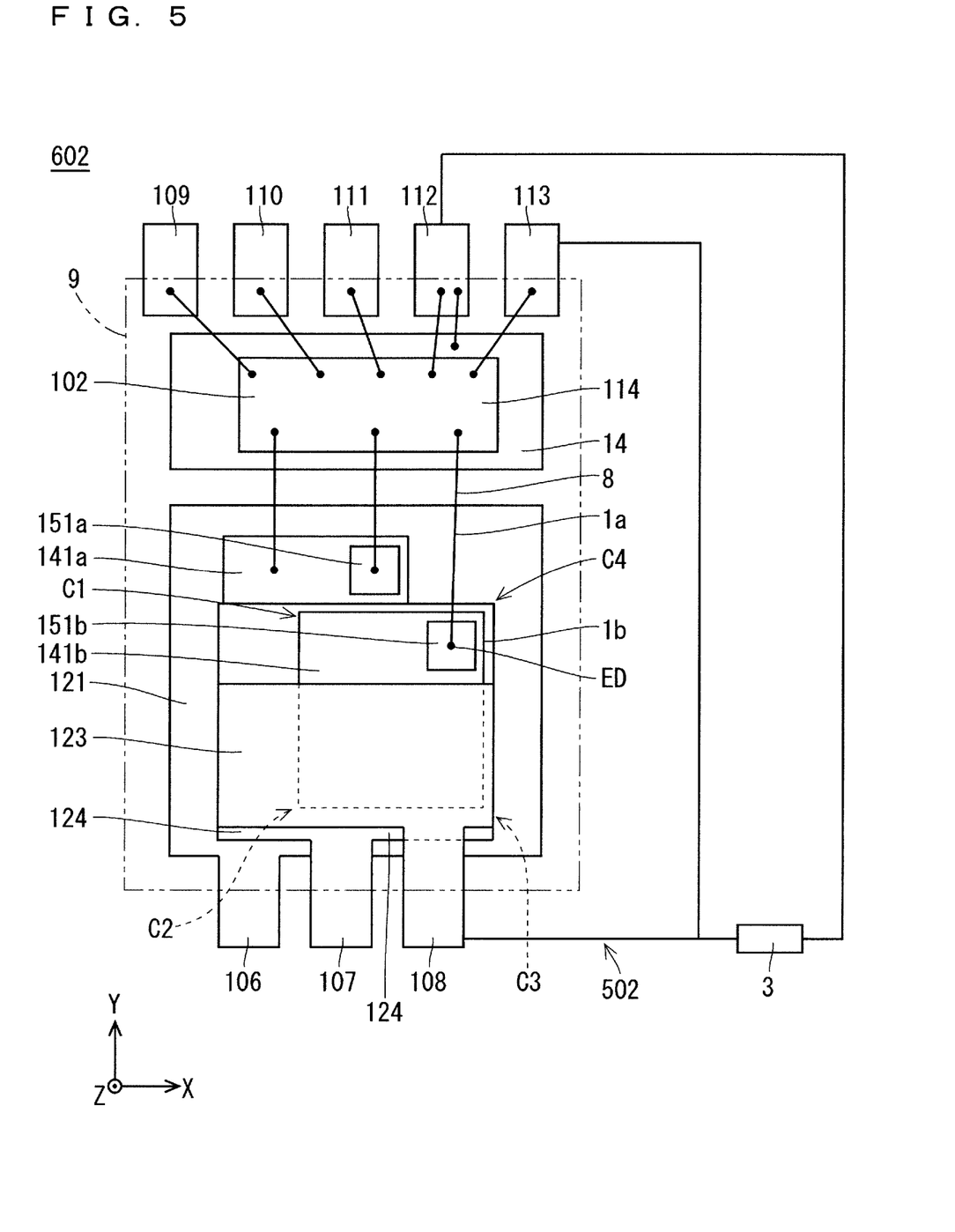
FIG. 5 is a plan view schematically showing a configuration of a power module and a shunt resistor according to a second preferred embodiment.

FIG. 5 is a plan view schematically showing a configuration of a power module 502 and a shunt resistor 3 according to the second preferred embodiment. The gate pad 151b is arranged at least partially outside the high-side switching element 141a in the in-plane direction, and is preferably arranged totally outside the high-side switching element 141a as shown in FIG. 5. An end ED of the bonding wire 8 bonded to the gate pad 151b is arranged outside the high-side switching element 141a in the in-plane direction. The low-side switching element 141b has first to fourth corners C1 to C4 in the in-plane direction, and the gate pad 151b of the low-side switching element 141b is located closer to the fourth corner C4 than to the first to third corners C1 to C3.

Since the configurations other than the above are almost the same as the configurations of the first preferred embodiment described above, the same or corresponding elements are given the same reference numerals, and their description is not repeated.

According to the present preferred embodiment, the gate pad 151b is arranged at least partially outside the high-side switching element 141a in the in-plane direction. Accordingly, a damage to the high-side switching element 141a caused by a process of obtaining electrical connection with the gate pad 151b of the low-side switching element 141b can be reduced. Specifically, it is possible to prevent cracking and chipping of a semiconductor chip as the high-side switching element 141a. Therefore, in the manufacture of the power module 502, the yield is improved, and thus the productivity is improved.

The end of the bonding wire is arranged outside the high-side switching element 141a in the in-plane direction. This makes it possible to reduce a damage to the high-side switching element 141a caused by the process of bonding the bonding wire. The gate pad 151b of the low-side switching element 141b is arranged near the fourth corner C4. As a result, while securing a large area for a portion of the low-side switching element 141b stacked on the high-side switching element 141a, the gate pad 151b of the low-side switching element 141b can be at least partially outside the high-side switching element 141a in the in-plane direction.

Third Preferred Embodiment

Figure 6:
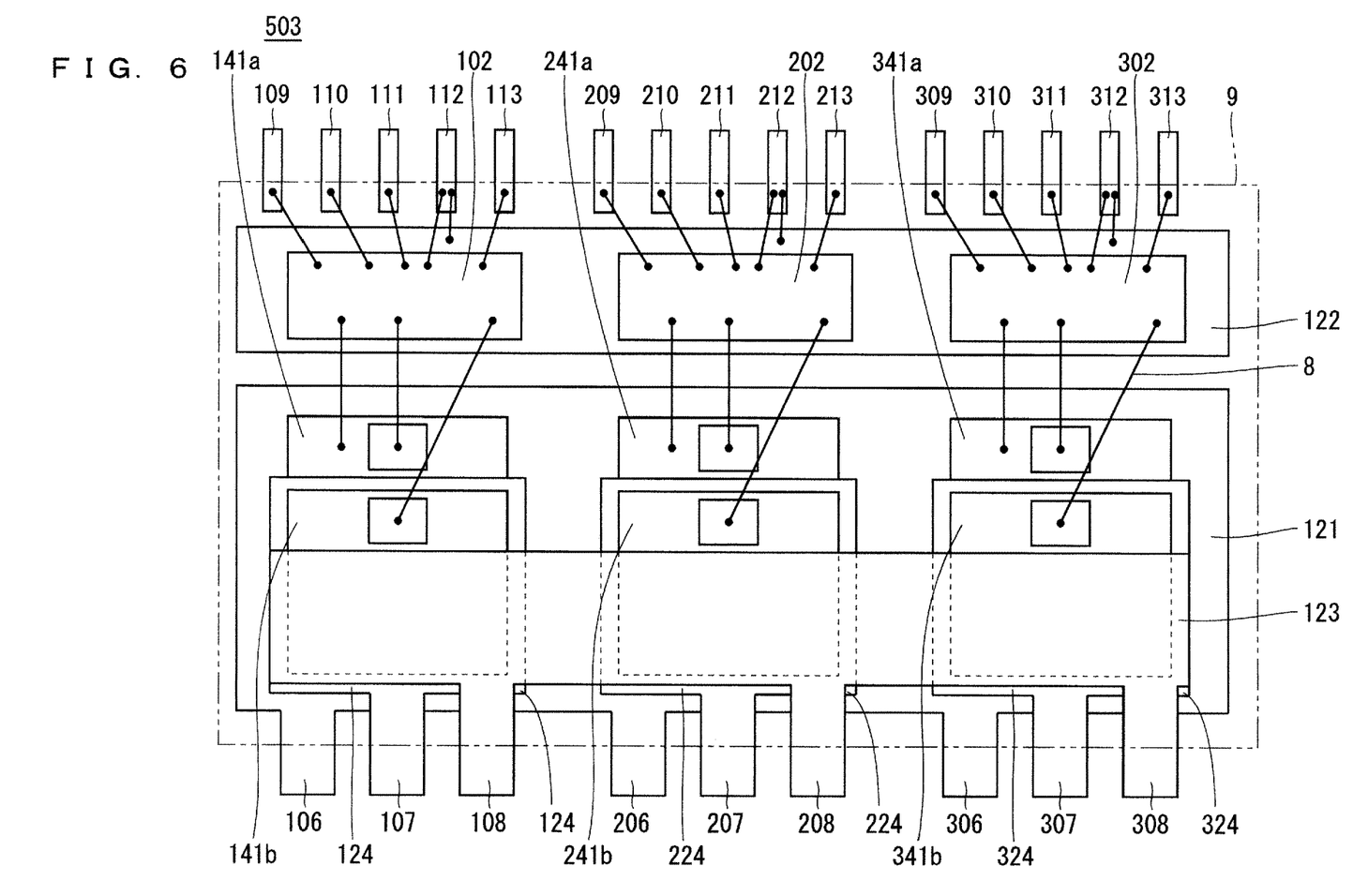
FIG. 6 is a plan view schematically showing a configuration of a power module according to a third preferred embodiment.

FIG. 6 is a plan view schematically showing a configuration of a power module 503 according to the third preferred embodiment.

The power module 503 includes a high-side switching element 241a (third semiconductor switching element), a low-side switching element 241b (fourth semiconductor switching element), and a control element 202 (second control element) that controls the high-side switching element 241a and the low-side switching element 241b. The low-side switching element 241b is connected in series with the high-side switching element 241a and is at least partially stacked on the high-side switching element 241a in the thickness direction. The control element 202 controls the high-side switching element 241a and the low-side switching element 241b. The control element 202 is arranged outside the high-side switching element 241a and the low-side switching element 241b in the in-plane direction.

The power module 503 also includes a high-side switching element 341a (fifth semiconductor switching element), a low-side switching element 341b (sixth semiconductor switching element), and a control element 302 (third control element) that controls the high-side switching element 341a and the low-side switching element 341b. The low-side switching element 341b is connected in series with the high-side switching element 341a, and is at least partially stacked on the high-side switching element 341a in the thickness direction. The control element 302 controls the high-side switching element 341a and the low-side switching element 341b. The control element 302 is arranged outside the high-side switching element 341a and the low-side switching element 341b in the in-plane direction.

The power module 503 has a P terminal 206, an output terminal 207, an N terminal 208, a Vcc terminal 209, a Vin-a terminal 210, a Vin-b terminal 211, a GND terminal 212, and a Cin terminal 213. Further, the power module 503 has a P terminal 306, an output terminal 307, an N terminal 308, a Vcc terminal 309, a Vin-a terminal 310, a Vin-b terminal 311, a GND terminal 312, and a Cin terminal 313.

With the above configuration, by inputting an external signal in an appropriate phase to the Vin-a terminal 110, the Vin-b terminal 111, the Vin-a terminal 210, the Vin-b terminal 211, the Vin-a terminal 310, and the Vin-b terminal 311, the power module 503 can generate three-phase AC from the output terminal 107, the output terminal 207, and the output terminal 307.

In the present preferred embodiment, the high-side switching element 141a, the high-side switching element 241a, and the high-side switching element 341a are mounted on the metal plate 121 via the conductive bonding layer 14 (see FIG. 3). Further, the metal plate 123 is bonded to the low-side switching element 141b, the low-side switching element 241b, and the low-side switching element 341b via the conductive bonding layer 14 (see FIG. 3).

Since the configurations other than the above are almost the same as the configurations of the above-described first and second preferred embodiments, the same or corresponding elements are given the same reference numerals, and their description is not repeated.

According to the present preferred embodiment, not only the control by the high-side switching element 141a and the low-side switching element 141b but also the control by the high-side switching element 241a and the low-side switching element 241b are performed. Therefore, it is possible to control a plurality of phases instead of a single phase. The three-phase control can be performed by further performing the control by the high-side switching element 341a and the low-side switching element 341b. Both the high-side switching element 141a and the high-side switching element 241a are mounted on the metal plate 121. As a result, a common potential can be supplied to both the high-side switching element 141a and the high-side switching element 241a with a simple configuration. In the present preferred embodiment, the high-side switching element 341a is also mounted on the metal plate 121, further simplifying the configuration. Due to this simplification, the area of the power module 503 in the in-plane direction can be reduced. As a modification, an individual metal plate may be provided for each of the high-side switching element 141a, the high-side switching element 241a, and the high-side switching element 341a.

The metal plate 123 is bonded to both the low-side switching element 141b and the low-side switching element 241b. As a result, a common potential can be supplied to both the low-side switching element 141b and the low-side switching element 241b with a simple configuration. In the present preferred embodiment, the metal plate 123 is also bonded to the low-side switching element 341b, further simplifying the configuration. Due to this simplification, the area of the power module 503 in the in-plane direction can be reduced. As a modification, an individual metal plate may be provided for each of the low-side switching element 141b, the low-side switching element 241b, and the low-side switching element 341b.

It is possible to freely combine the preferred embodiments, and to modify or omit each of the preferred embodiments as appropriate.

While the disclosure has been shown and described in detail, the foregoing description is in all aspects illustrative and not restrictive. It is therefore understood that numerous modifications and variations can be devised.

What is claimed is:

1. A power module having a thickness direction and an in-plane direction perpendicular to the thickness direction, the power module comprising:
   a first semiconductor switching element;
   a second semiconductor switching element connected in series with the first semiconductor switching element and at least partially stacked on the first semiconductor switching element in the thickness direction; and
   a first control element that controls the first semiconductor switching element and the second semiconductor switching element, and performs an overcurrent protection operation with reference to a shunt voltage input to the first control element, wherein
   the first control element is arranged outside the first semiconductor switching element and the second semiconductor switching element in the in-plane direction.

2. The power module according to claim 1, wherein the shunt voltage is measured across an impedance connected to the first semiconductor switching element and the second semiconductor switching element.

3. A power module having a thickness direction and an in-plane direction perpendicular to the thickness direction, the power module comprising:

a first semiconductor switching element;
a second semiconductor switching element connected in series with the first semiconductor switching element and at least partially stacked on the first semiconductor switching element in the thickness direction;
a first control element that controls the first semiconductor switching element and the second semiconductor switching element, and performs an overcurrent protection operation with reference to a shunt voltage;
a first metal plate on which the first semiconductor switching element is mounted; and
a second metal plate on which the first control element is mounted, the second metal plate being separated from the first metal plate, wherein
the first control element is arranged outside the first semiconductor switching element and the second semiconductor switching element in the in-plane direction, and
the second metal plate is arranged outside the first semiconductor switching element and the second semiconductor switching element in the in-plane direction.

4. The power module according to claim 3, further comprising a conductive bonding layer that mechanically bonds the first control element to the second metal plate and electrically connects the first control element to the second metal plate.

5. A power module having a thickness direction and an in-plane direction perpendicular to the thickness direction, the power module comprising:
a first semiconductor switching element;
a second semiconductor switching element connected in series with the first semiconductor switching element and at least partially stacked on the first semiconductor switching element in the thickness direction; and
a first control element that controls the first semiconductor switching element and the second semiconductor switching element, and performs an overcurrent protection operation with reference to a shunt voltage, wherein
the first control element is arranged outside the first semiconductor switching element and the second semiconductor switching element in the in-plane direction, and
the second semiconductor switching element has a gate pad that receives a control signal from the first control element, and the gate pad is arranged at least partially outside the first semiconductor switching element in the in-plane direction.

6. The power module according to claim 5, further comprising a bonding wire having an end bonded to the gate pad of the second semiconductor switching element, wherein the end of the bonding wire is arranged outside the first semiconductor switching element in the in-plane direction.

7. The power module according to claim 5, wherein the second semiconductor switching element has first to fourth corners in the in-plane direction, and the gate pad of the second semiconductor switching element is located closer to the fourth corner than to the first to third corners.

8. A power module having a thickness direction and an in-plane direction perpendicular to the thickness direction, the power module comprising:
a first semiconductor switching element;
a second semiconductor switching element connected in series with the first semiconductor switching element and at least partially stacked on the first semiconductor switching element in the thickness direction;
a first control element that controls the first semiconductor switching element and the second semiconductor switching element, and performs an overcurrent protection operation with reference to a shunt voltage;
a third semiconductor switching element;
a fourth semiconductor switching element connected in series with the third semiconductor switching element and at least partially stacked on the third semiconductor switching element in the thickness direction; and
a second control element that controls the third semiconductor switching element and the fourth semiconductor switching element, wherein
the first control element is arranged outside the first semiconductor switching element and the second semiconductor switching element in the in-plane direction, and
the second control element is arranged outside the third semiconductor switching element and the fourth semiconductor switching element in the in-plane direction.

9. The power module according to claim 8, further comprising a first metal plate on which the first semiconductor switching element and the third semiconductor switching element are mounted.

10. The power module according to claim 8, further comprising a third metal plate bonded to the second semiconductor switching element and the fourth semiconductor switching element.

* * * * *